United States Patent [19]

Tanaka et al.

[11] Patent Number: 4,715,050
[45] Date of Patent: Dec. 22, 1987

[54] DIGITAL PHASE-LOCKED LOOP CIRCUIT

[75] Inventors: Koichi Tanaka; Satoshi Itoh, both of Kawasaki, Japan

[73] Assignee: Kabushiki Kaisha Toshiba, Kawasaki, Japan

[21] Appl. No.: 23,227

[22] Filed: Mar. 9, 1987

[30] Foreign Application Priority Data

Mar. 31, 1986 [JP] Japan .................................. 61-71151

[51] Int. Cl.$^4$ .......................... H03D 3/24; H04L 7/04
[52] U.S. Cl. .................................. 375/111; 375/120;
375/81; 328/109; 328/155; 307/525; 377/43
[58] Field of Search ................. 375/111, 120, 94, 102, 375/81; 328/109, 155, 63; 307/525, 518, 511; 377/43

[56] References Cited

U.S. PATENT DOCUMENTS

| 4,351,000 | 9/1982 | Tokumatsu | 375/120 |
| 4,498,103 | 2/1985 | Aschwanden | 375/120 |
| 4,584,695 | 4/1986 | Wong et al. | 375/81 |

FOREIGN PATENT DOCUMENTS

60-227541 11/1985 Japan .

Primary Examiner—Robert L. Griffin
Assistant Examiner—Marianne Huseman
Attorney, Agent, or Firm—Finnegan, Henderson, Farabow, Garrett & Dunner

[57] ABSTRACT

During the receipt of a result of comparison from the phase detector representing that the synchronization signal is phase-delayed behind the input signal, the selection circuit sequentially selects the M number of counters, one by one, in a cyclic fashion, in such a direction as to permit the reference clock input to be phase-advanced correspondingly, so that the frequency-divided output signal from the counter to the phase detector can be sequentially phase advanced by 1/M of one cycle of the reference clock. During the receipt of a result of the comparison indicating that the synchronization signal is phase-advanced ahead of the input signal, on the other hand, the selection circuit sequentially selects the M number of counters, one by one, in a cyclic fashion, in such a direction as to allow the reference clock input to be phase-delayed, so that the frequency divided output signal from the counter to the phase detector can be sequentially phase-delayed by 1/M of one cycle of the reference click. When a phase difference occurs between the input signal and the synchronization signal, one cycle time of the synchronization signal is increased or decreased by 1/M of one cycle of the reference clock, thus assuring an enhanced time resolution.

6 Claims, 10 Drawing Figures

DIGITAL PHASE-LOCKED LOOP CIRCUIT

BACKGROUND OF THE INVENTION

This invention relates to a digital phase-locked loop (PLL) circuit for use in a signal demodulation circuit, etc., which generates a synchronization signal in synchronization with an input signal.

Figure 1:
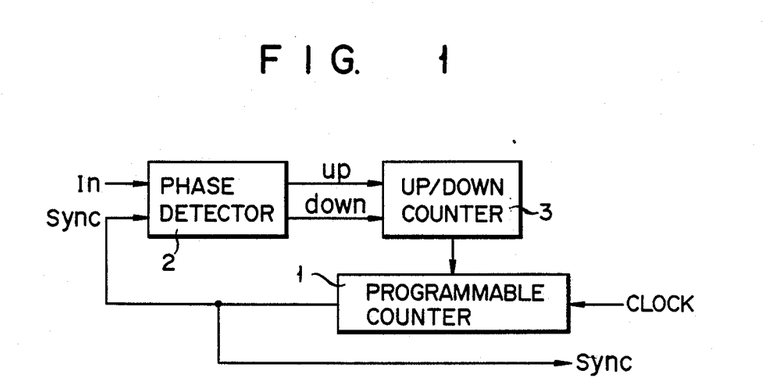
FIG. 1 is a circuit diagram showing a conventional digital PLL circuit.

A conventional PLL circuit is shown in FIG. 1 which generates a signal in synchronization with an input signal during a serial data transmission.

In this PLL circuit, programmable counter 1 receives and frequency-divides a reference clock pulse of a frequency substantially N times (N: an integer) the frequency of an input signal In to produce a synchronization signal. Phase detector or phase comparator 2 detects a phase difference between the synchronization signal and input signal to allow the preset value of up-/down counter 3 to be incremented or decremented so that the frequency division ratio of programmable counter 1 may be varied. Where the input signal is phase-advanced ahead of the synchronization signal, the frequency division ratio is made smaller to advance the phase of the synchronization signal. Where, on the other hand, the input signal is phase-delayed behind the synchronization signal, the frequency division ratio is made greater to delay the phase of the synchronization signal.

In the conventional PLL circuit, the phase of the synchronization signal varies in units of $2\pi/N$ radians and, in order to obtain a minute phase difference or time resolution, it is necessary to enhance the frequency of the reference clock and thus make the value of N greater. A programmable counter and an associated input circuit are thus required to perform a high-speed operation. However, the high-speed operation is restricted in the programmable counter and it is therefore difficult to implement a programmable counter of such a type as to satisfy the requirement for a high-speed operation. Since, even if the phase of the input signal substantially coincides with that of the synchronization signal, that is, the phase difference is set within a range of $\pm 2\pi/N$, a fluctuation occurs by the phase of $\pm 2\pi/N$ radians, and it is difficult to obtain a stable synchronization signal.

SUMMARY OF THE INVENTION

It is accordingly an object of this invention to provide a digital phase-locked loop circuit whereby, without increasing the frequency of a reference clock signal or using a high-speed programmable counter, an enhanced time resolution and the reduction of a fluctuation in the phase of a synchronization signal can both be achieved, which have so far been impossible in a conventional counterpart.

According to the present invention, there is provided a reference clock generator for generating an M (M: an integer of 2 or more) number of reference clock inputs having a frequency substantially the same as N times (N: an integer) the frequency of an input signal and sequentially phase-shifted by $2\pi/M$ radians, an M number of counters for frequency-dividing the M number of reference clock inputs, the respective counters being sequentially operated upon receipt of a selection signal and each delivering a first output signal through a third output signal in a predetermined timing relation, a phase detector for making a phase comparison between the first output signal of selected one of said M number of counters and said input signal and producing one of a first signal representing a phase delay of said first output signal of said selected counter and a second signal representing a phase advance of said first output signal of said selected counter, and a selection circuit for receiving the signals of said phase detector and the output signals of said M number of counters and sequentially delivering the selection signal in a cyclic fashion in a predetermined direction to said M number of counters to decrease the phase difference between both the signals supplied to said phase detector so that the first output signal of the selected counter is used as a synchronization output signal.

In the PLL circuit of this invention, a reference clock generator delivers an M number (M: an integer of 2 or more) of reference clock signals having a frequency substantially N times (N: an integer) the frequency of an input signal and sequentially phase-shifted by $2\pi/M$ radians to an M number of counters for frequency division, a phase detector makes a phase comparison between the input signal and a predetermined one of the output signals of a selected counter and delivers an up-signal or a down-signal, and a selection circuit selects one of the M number of counters upon receipt of an up- or down-signal of the phase detector and output signals of the counters.

During the receipt of a result of comparison representing that the synchronization signal is phase-delayed behind the input signal, the selection circuit sequentially selects the M number of counters one by one in a cyclic fashion in such a direction as to permit the reference clock input to be correspondingly phase-advanced. As a result, the frequency-divided output signal from the counter to be supplied to the phase detector can be sequentially phase-advanced by 1/M of one cycle of the reference clock. During the receipt of a result of comparison indicating that the synchronization signal is phase advanced ahead of the input signal, on the other hand, the selection circuit sequentially selects the M number of counters one by one in a cyclic fashion in such a direction as to allow the reference clock input to be phase-delayed. In this way, the frequency-divided output signal from the counter to be supplied to the phase detector can be sequentially phase-delayed by 1/M of one cycle of the reference clock.

Thus, where a phase difference occurs between the input signal and the synchronization signal, one cycle time of the synchronization signal is increased or decreased by 1/M of one cycle of the reference clock, thus assuring an enhanced time resolution. Where a phase coincidence substantially occurs between the input signal and the synchronization signal, that is, where the phase difference is within a range of $\pm 2\pi/(N \times M)$, the phase delaying and advancing operations are cyclically repeated according to this invention and thus a fluctuation in the phase of the consequent synchronization signal is restricted to $\pm 2\pi/(N \times M)$ radians.

DETAILED DESCRIPTION OF THE PREFERRED EMBODIMENTS

A digital PLL circuit according to an embodiment of this invention will be explained below with reference to the accompanying drawings.

Figure 2:
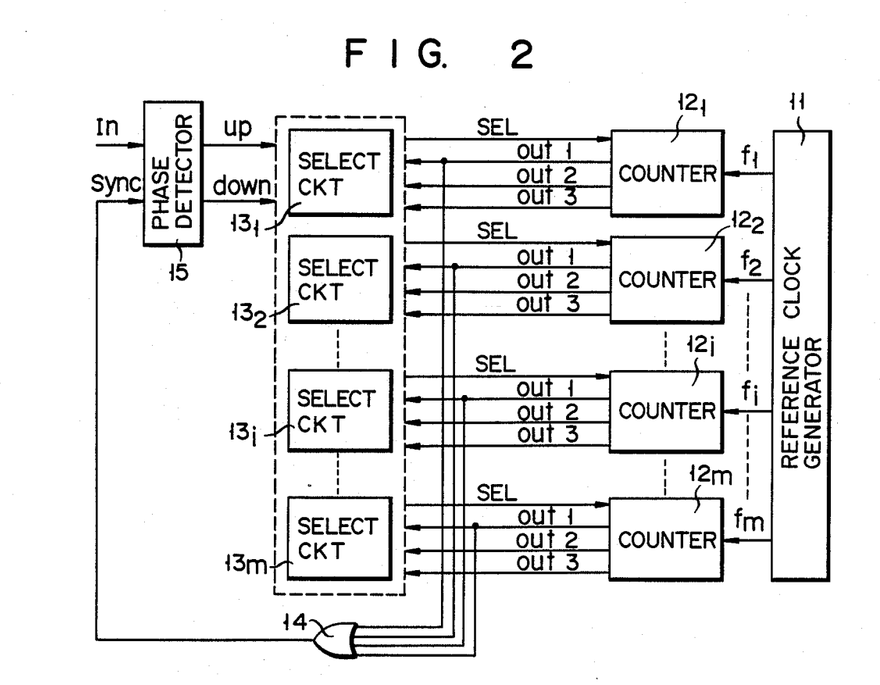
FIG. 2 is a circuit diagram showing a digital PLL circuit according to an embodiment of this invention.

In FIG. 2, input signal In is input to phase comparator or phase detector 15. Reference clock generator 11 generates an M number of reference clocks $f_1, f_2, \ldots f_i, \ldots f_m$, (M=m: an integer more than 2) each having a frequency substantially the same as N times (N: an integer) the frequency of input signal In and having a phase difference of a 2 /M radians. Reference clocks $f_1, f_2, \ldots f_i, \ldots f_m$ are supplied as count inputs to counters $12_1, 12_2, \ldots 12_i, \ldots 12_m$. Counters $12_1, 12_2, \ldots 12_i, \ldots 12_m$ frequency-divide the reference clocks $f_1, f_2, \ldots f_i, \ldots f_m$, respectively.

Counters $12_1, 12_2, \ldots 12_i, \ldots 12_m$ start operation and count reference clocks $f_1, f_2, \ldots f_i, \ldots f_m$, when counters $12_1, 12_2, \ldots 12_i, \ldots 12_m$ receive a selection signal SEL from selection circuits $13_1, 13_2, \ldots 13_i, \ldots 13_m$ provided in correspondence to counters $12_1, 12_2, \ldots 12_i, \ldots 12_m$.

Specifically, when counter $12_1$ receives selection signal SEL from selection circuit $13_1$, counter $12_1$ starts to operate and count reference clock $f_1$ from reference clock generator 11 and generates frequency-divided output signals out1, out2 and out3. When counter $12_2$ receives selection signal SEL from selection circuit $13_2$, counter $12_2$ starts to operate and count reference clock $f_2$ from reference clock generator 11 and generates frequency-divided output signals out1, out2 and out3. When counter $12_i$ receives selection signal SEL from selection circuit $13_i$, counter $12_i$ starts to operate and count reference clock $f_i$ from reference clock generator 11 and generates frequency-divided output signals out1, out2 and out3. Similarly, when counter $12_m$ receives selection signal SEL from selection circuit $13_m$, counter $12_m$ starts to operate and count reference clock $f_m$ from reference clock generator 11 and generates frequency-divided output signals out1, out2 and out3. First output signals out1 of counters $12_1, 12_2, \ldots 12_i, \ldots 12_m$ are different in phase. Second output signals out2 of counters $12_1, 12_2, \ldots 12_i, \ldots 12_m$ are different in phase. Similarly, third output signals out3 of counters $12_1, 12_2, \ldots 12_1, \ldots 12_m$ are different in phase.

Each selection circuit receives first output signals out1 of those counters other than the currently-selected counter. Specifically, selection circuit $13_1$ receives first output signals out1 from counters $12_2, 12_3, \ldots 12_i, \ldots 12_m$. Selection circuit $13_2$ receives first output signals out1 from counters $12_1, 12_3, \ldots 12_i, \ldots 12_m$. Selection circuit $13_i$ receives first output signals out1, from counters $12_1, 12_2, \ldots 12_{i-1}, 12_{i+1}, \ldots 12_m$. Similarly, selection circuit $13_m$ receives first output signals out1 from counters $12_1, 12_2, \ldots 12_i, \ldots 12_{m-1}$.

Each selection circuit also receives second output signal out2 of the counter for receiving the reference clock advanced by $2\pi/M$, compared to that received by the counter corresponding to the currently-operated selection circuit. Specifically, selection circuit $13_1$ receives second output signal out2 of counter $12_2$. Selection circuit $13_2$ receives second output signal out2 of counter $12_3$. Selection circuit $13_i$ receives second output signal out2 of counters $12_{i+1}$. Similarly, selection circuit $13_m$ receives second output signal out2 of counter $12_1$.

Each selection circuit also receives third output signal out3 of the counter for receiving the reference clock behind by $2\pi/M$, compared to that received by the counter corresponding to the currently-operated selection circuit. Specifically, selection circuit $13_1$ receives third output signal out3 of counter $12_m$. Selection circuit $13_2$ receives third output signal out3 of counter $12_1$. Selection circuit $13_i$ receives third output signal out3 of counter $12_{i-1}$. Similarly, selection circuit $13_m$ receives third output signal out3 of counter $12_{m-1}$.

First output signals out1 from all the counters are also input to OR gate circuit 14. OR circuit 14 takes a logical sum of the first output signals out1 of all the counters and produces an output signal as a synchronization signal Sync. Synchronization signal Sync is input to phase detector 15 and also is output at an output terminal of the whole circuit. Phase detector 15 receives the synchronization signal Sync and input signal In and compares them with each other. The phase detector delivers an up-signal when the synchronization signal is phase-delayed and a down-signal when the synchronization signal is phase-advanced.

Figure 3:
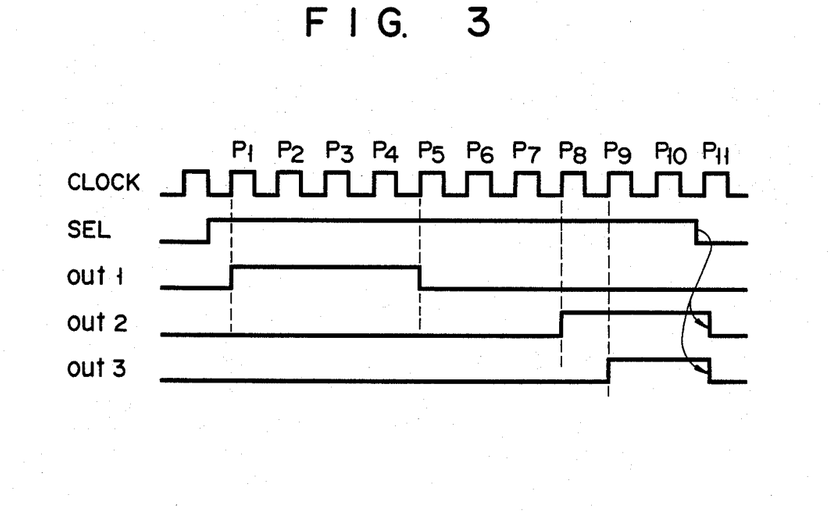
FIG. 3 shows a time chart of the operation of counters in a PLL circuit of FIG. 2.

Each of the selection circuits delivers selection signal SEL according to the up- or down-signal and the output signals from the counters. A typical signal chart of counters $12_1, 12_2, \ldots 12_i, \ldots 12_m$ is shown in FIG. 3. The operation of counter $12_1$ will now be explained below with reference to FIG. 3.

Counter $12_1$ starts a count operation of input reference clocks $f_1$ upon receipt of selection signal SEL from selection circuit $13_1$.

Reference clock $f_1$ has a frequency substantially eight times (N times) the frequency of input signal In. When counter $12_1$ receives selection signal SEL from selection circuit $13_1$, counter $12_1$ starts to count and frequency-divide input reference clock $f_1$. When selection signal SEL of selection circuit $13_1$ stops, counter $12_1$ stops its counting operation. Counter $12_1$ outputs first output signal out1 from the start time of its counting operation until that count is made 8/2=4 times (N/2 times). That is, counter $12_1$ outputs first output signal out1 from the rising edge of first pulse $P_1$ to the rising edge of fifth pulse $P_5$. Counter $12_1$ also outputs second output signal out2 from the eighth (Nth) count time until selection signal SEL from selection circuit $13_1$ stops. That is, counter $12_1$ outputs second output signal out2 from the rising edge of eighth pulse $P_8$ to the end of selection signal SEL of selection circuit $13_1$. Counter $12_1$ also outputs third output signal out from the ninth {(N+1)th } count time until selection signal SEL of selection circuit $13_1$ stops. That is, counter $12_1$ outputs third output signal out3 from the rising edge of ninth pulse $P_9$ to the end of selection signal SEL of selection circuit $13_1$.

Other counters $12_2, \ldots 12_i, \ldots 12_m$ are operated substantially in the same manner as in counter $12_1$, therefore the description of operation thereof are omitted.

Figure 4:
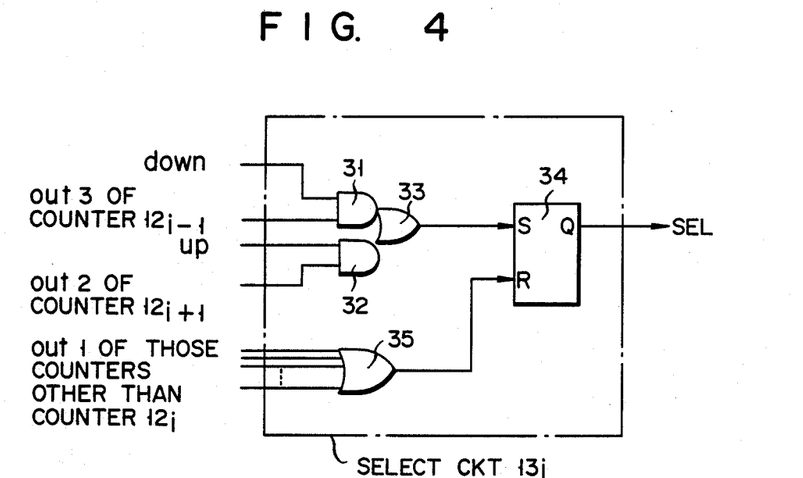
FIGS. 4, 5 and 6 show a practical form of selection circuits $13_i$, $13_l$ and $13_m$ in a PLL circuit of FIG. 2, respectively.
Figure 5:
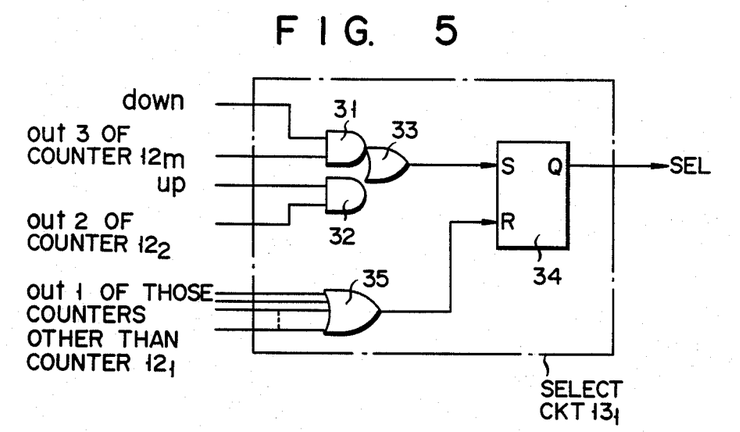
Figure 6:
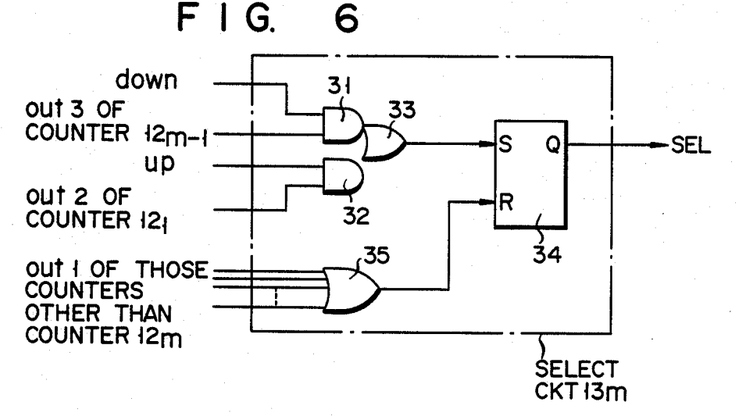

FIG. 4 shows a typical form of selection circuit $13_i$. That is, a 2-input AND gate 31 receives a down-signal from phase detector 15 and a third output signal out3 from counter $12_{i-1}$, and a 2-input AND gate 32 receives an up-signal from phase detector 15 and a second signal out2 from counter $12_{i+1}$. A 2-input OR gate 33 receives the outputs of AND gates 31 and 32 to take a logical sum thereof and the logical sum output of OR gate 33 is supplied to a set terminal S of SR type flip-flop circuit 34. OR gate 35 receives the first output signals out1 of those counters other than counter $12_i$ to take a logical sum and delivers a logical sum output to a reset terminal R of SR type flip-flop 34. Flip-flop circuit 34 delivers selection signal SEL as a Q output. As shown in FIG. 5, for selection circuit $13_1$, use is made, as third signal out3 from $12_{i-1}$, of third signal out3 from counter $12_m$. Also, as shown in FIG. 6, for selection circuit $13_m$, second signal out2 from counter $12_1$ is used as counter $12_{i+1}$. Selection circuit $13_i$ delivers the selection signal SEL when it receives the down-signal from phase detector 15 and third signal out3 from counter $12_{i-1}$ or when it receives the up-signal from phase detector 15 and second signal out2 of the counter $12_{i+1}$. The selection signal continues until selection circuit $13_i$ receives first signal out1 from those counters other than counter $12_i$.

Figure 7:
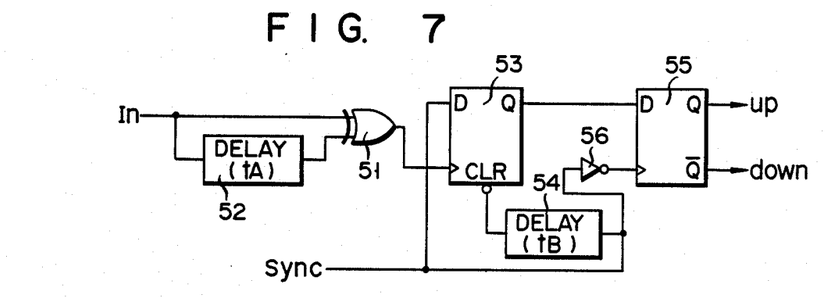
FIG. 7 shows a typical form of phase detector shown in FIG. 2.

A typical form of phase detector 15 is shown in FIG. 7. Input signal In is input to one terminal of exclusive OR gate 51 directly and also input to the other terminal of the OR gate 51 through delay circuit 52 having delay time $t_A$. An output pulse of the exclusive OR gate 51 is input to the trigger terminal of D-type flip-flop circuit 53. Synchronization signal Sync is input to the D-terminal of flip-flop circuit 53. The synchronization signal is also input to the clear-terminal CLR of flip-flop circuit 53 through delay circuit 54 having delay time $t_B$. The synchronization signal is also input to the trigger terminal of D-type flip-flop circuit 55 through inverter 56. The Q output of flip-flop circuit 53 is input to the D-terminal of flip-flop circuit 55. The Q output of flip-flop circuit 55 is used as an up-signal and $\overline{Q}$ output of flip-flop circuit 55 is used as a down-signal.

Figure 8:
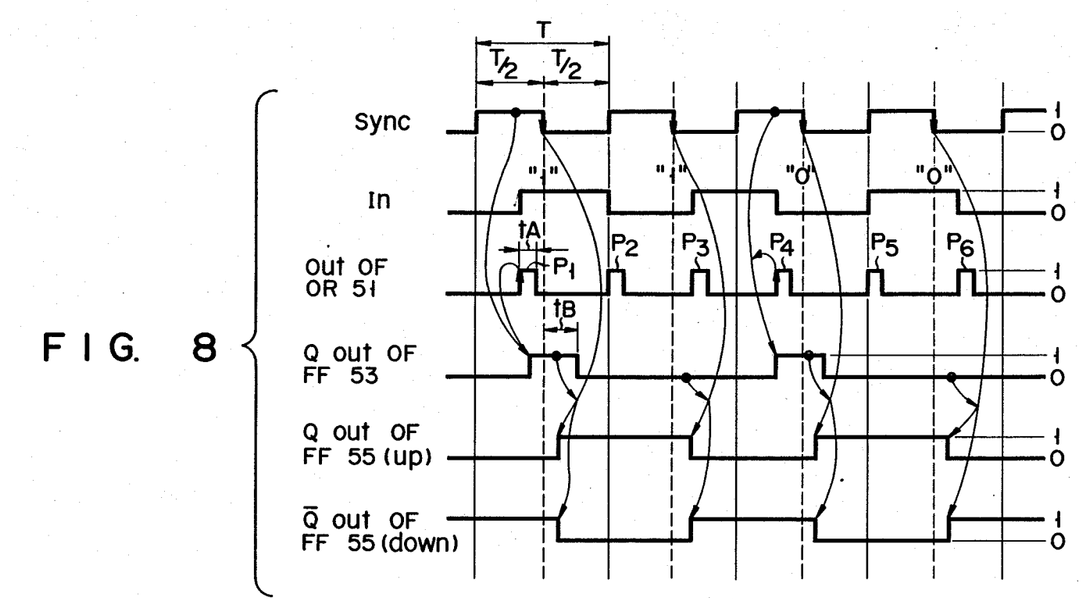
FIG. 8. shows a time chart of the operation of the phase detector of FIG. 7.

The operation of phase detector shown in FIG. 7 will now be described with reference to the signal charts of FIG. 8.

When a level of the input signal is inverted, the exclusive OR gate 51 outputs pulse $P_1$, $P_2$, $P_3$, $P_4$, $P_5$ or $P_6$ having time width tA. Since pulse $P_1$ is intermediate in one bit time T, synchronization signal Sync is sampled by flip-flop circuit 53 at the rising edge of pulse $P_1$. Therefore, the Q output of flip-flop circuit 53 is rendered to logic 1 level. When the synchronization signal falls to logic 0 level, flip-flop circuit 55 samples Q output of flip-flop circuit 53 to produce an up-signal. The synchronization signal is delayed through delay circuit 54 with time tB and input to CLR terminal of flip-flop circuit 53. Therefore, after the time tB has elapsed from when the synchronization signal falls to logic 0 level, Q output of flip-flop circuit 53 is rendered to logic "0" level.

When Manchester encoded input data has successive bits of a same value for example, "1", "1" or "0", "0", a level inversion occurs between the adjacent bits of a same value. At this time, exclusive OR circuit 51 produces pulses $P_2$ or $P_5$. However, pulses $P_2$, $P_5$ should be prevented from being used as a sampling signal of the syncroniization signal. In order to achieve the prevention, delay circuit 54 is provided. By the provision of delay circuit 54, Q output of flip-flop circuit 53 is kept at logical "0" level during delay time tB of delay circuit 54 after the synchronization signal rises to logic 1 level. Therefore, even when pulses $P_2$ or $P_5$ appear while the time tB has not elapsed from when the synchronization signal rises to logic 1 level, the Q output of flip-flop circuit 53 is not changed by the ineffective pulses $P_2$, $P_5$. When an inversion of the input signal appears after a falling of the synchronization signal and pulse $P_3$ appears, since Q output of flip-flop circuit 53 is kept at logic "0" level, a down-signal is generated.

The operation of the digital PLL circuit of FIG. 2, when, for example, N=4 and M=3, will be explained below with reference to FIGS. 9 and 10. Counter $12_3$ and selection circuit $13_3$ referred to in the following descriptions are not shown, in order to simplify the drawings.

Figure 9:
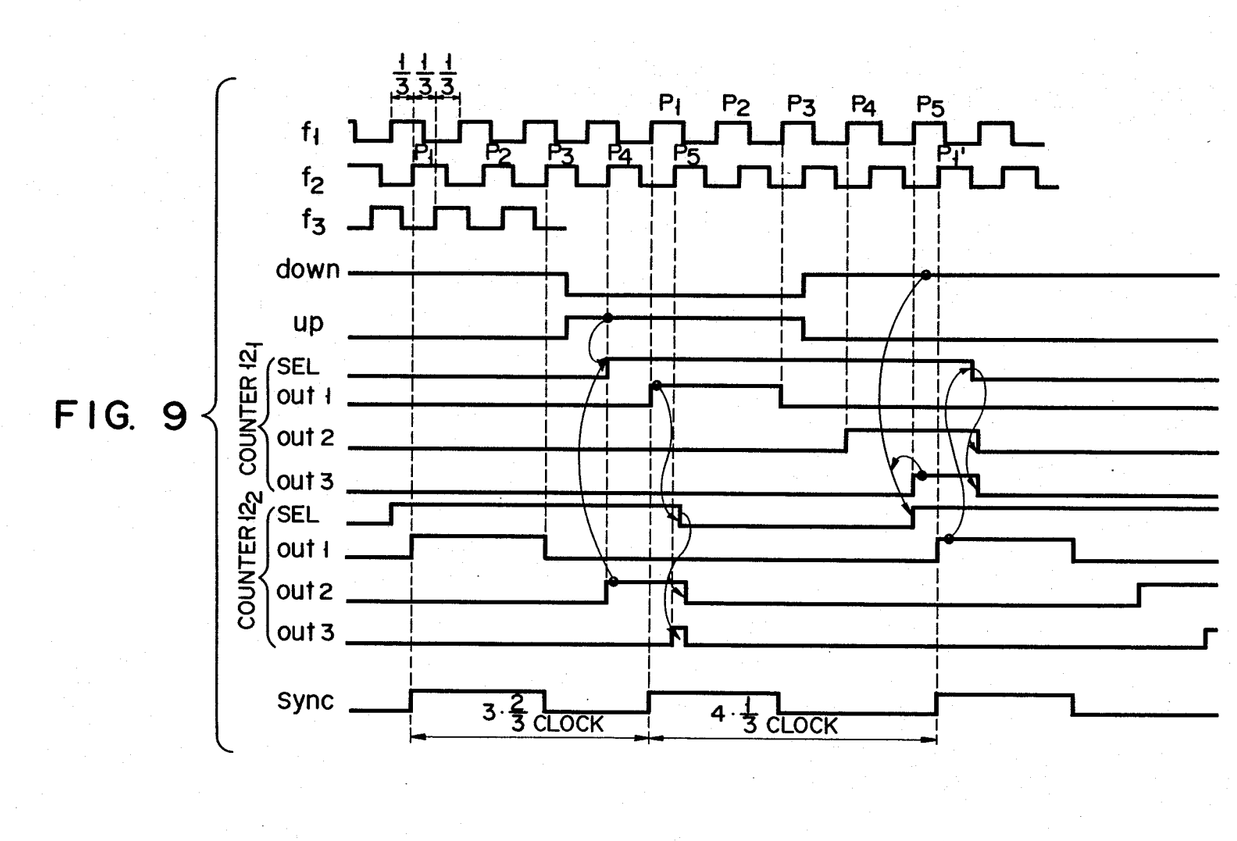
FIG. 9 shows a time chart of the operation of the digital PLL circuit of FIG. 2.
Figure 10:
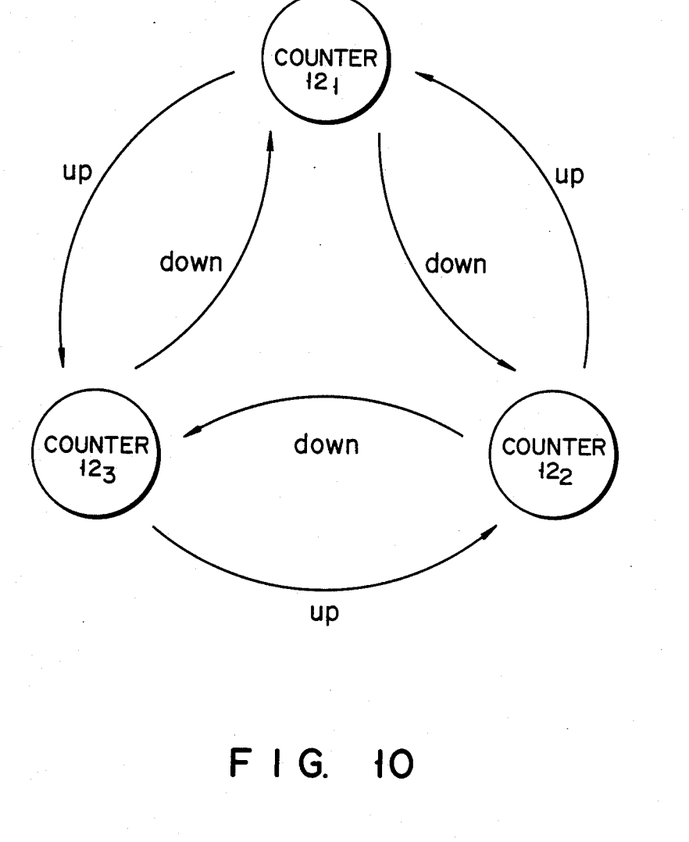
FIG. 10 is a view showing an operation sequence of counters of the digital PLL circuit shown in FIG. 2.

In FIG. 9, the reference clocks $f_1$, $f_2$, $f_3$ are sequentially phase-delayed by a ⅓ clock cycle (that is, ⅔ radians corresponding to one-third the cycle period of $f_1$, $f_2$, $f_3$) and input to first, second and third counters $12_1$, $12_2$, $12_3$ for counting. In FIG. 9, for brevity in explanation, the signal waveforms of counters $12_1$, $12_2$ alone are shown with the waveform of counter $12_3$ omitted.

Assume that counter $12_2$ is selected by selection signal SEL from selector $13_2$. Counter $12_2$ performs a counting operation of reference clock $f_2$, from the leading edge of the reference clock $f_2$, as indicated by "$P_1$" in FIG. 9, and the first signal out1 through the third signal out3 are delivered as frequency-divided output signals. Since at this time counter $12_1$ and $12_3$ stop their operation, the first signal out1 of counter $12_2$ is output, as the synchronization signal Sync, through OR gate circuit 14. The synchronization signal Sync, together with the input signal In, is supplied to phase detector 15 for phase comparison.

When the synchronization signal Sync is behind the input signal In in phase, phase detector 15 delivers an up-signal. The up-signal is supplied to selection circuits $13_1$, $13_2$, $13_3$. The second signal out2 from counter $12_2$ is supplied to the selection circuit $13_1$. Since selection circuit $13_1$ receives both the up-signal and the second signal out2 from counter $12_2$, selection circuit $13_1$ delivers selection signal SEL to counter $12_1$ at a point of time at which counter $12_2$ generates the second signal out2, i.e. at the leading edge of the reference clock $f_2$, as indicated by "$P_4$" in FIG. 9. Thus, counter $12_1$ starts its counting operation of the reference clock $f_1$ from the leading edge of the reference clock $f_1$, as indicated by "$P_1$", occurring after the receipt of the selection signal SEL from selection circuit $13_1$, and delivers the first signal out1 through the third signal out3. By the first signal out1 of counter $12_1$, the selection signal SEL of selection circuit $13_2$ turns off, stopping the operation of counter $12_2$. Thus, in place of the first signal out1 from counter $12_2$, the first signal out1 of counter $12_1$ is now input, as the synchronizing signal, to phase detector 15. Since the reference clock $f_1$ is phase-advanced by a ⅓ clock cycle with respect to the reference clock $f_2$, the leading edge of the reference clock $f_1$, as indicated by "$P_1$" in FIG. 9, is phase-advanced by a ⅓ clock cycle with respect to that of the reference clock $f_2$, as indicated by "$P_5$" in FIG. 9. In this way, the synchronization signal is phase-advanced by the ⅓ clock cycle in comparison with the case where the first signal out1 is repeatedly output through the continued operation of counter $12_2$.

When, on the other hand, the synchronization signal is phase-advanced, then phase detector 15 delivers a down-signal as an output signal. For convenience sake, assume that counter $12_1$ is selected by the selection signal SEL from selection circuit 13₁, though the output waveform of third counter 12₃ is not shown in FIG. 9. Counter 12₁ performs a counting operation of reference clock f₁, from the leading edge of the reference clock f₁, as indicated by "P₁" in FIG. 9, and delivers the first signal out1 through third signal out3. Since, at this time, counters 12₂ and 12₃ stop their operation, the first signal out1 of counter 12₁ is delivered, as a synchronization signal, through OR circuit 14 to phase comparator 15. Phase detector 15 compares the synchronization signal with the input signal with respect to their phase and delivers a down-signal to the selection circuits 13₁, 13₂, and 13₃. The third signal out3 from counter 12₁ is supplied to second selection circuit 13₂. Since selection circuit 13₂ receives both the down-signal and the third signal out3 from counter 12₁, selection circuit 13₂ delivers the selection signal SEL to counter 12₂ when third signal out3 of counter 12₁ is generated, that is, at the leading edge of the reference clock f₁, as indicated by "P₅" in FIG. 9. Counter 12₂ starts its counting operation of the reference clock f₂, from the leading edge of the reference clock f₂, as indicated by "P₁'", occurring after the receipt of the selection signal SEL from the selection circuit 13₂, and delivers a first signal out1 through a third signal out3. Because of first signal out1 of counter 12₂, the selection signal SEL of the first selection circuit 13₁ turns off, and counter 12₁ stops its counting operation. Thus, in place of the first signal out1 of counter 12₁, the first signal out1 of counter 12₂ is now supplied, as a synchronization signal, to phase detector 15. Since the reference clock f₂ is phase-delayed by a ⅓ clock cycle with reference to the reference clock f₁, the leading edge of the reference clock f₂, as indicated by "P₁'", is phase-delayed by a ⅓ clock cycle with respect to the leading edge of the reference clock f₁, as indicated by "P₅" in FIG. 9, and the synchronization signal obtained is delayed by a ⅓ clock cycle.

As will be understood from the above, when the synchronization signal is phase-delayed behind the input signal, phase detector 15 generates up-signals to the selection circuits. The selection circuits sequentially operate counters 12₁, 12₂, 12₃ in a cyclic fashion, in the order of 12₁→12₃→12₂→12₁, in a direction in which the reference clock input in sequentially phase-advanced (FIG. 10). Therefore, the synchronization signal is phase-advanced by a ⅓ clock cycle for each variation. When, on the other hand, the synchronization signal is phase-advanced ahead of the input signal, phase detector 15 generates down-signals to the selection circuits. Therefore, the selection circuits sequentially operate counters 12₁, 12₂, 12₃ in a cyclic fashion, in the order of 12₁→12₂→12₃→12₁, and thus the synchronization signal can be phase-delayed by a ⅓ clock cycle for each variation (FIG. 10). Since the synchronization signal is controlled by a ⅓ clock cycle for each variation, the one-cycle time of the synchronization signal is controlled by units of $$\pm \frac{2\pi}{4 \times 3} \text{ radians} \left( = \pm \frac{\pi}{6} \text{ radians} \right)$$

thus markedly enhancing a "time resolution" of the synchronization signal. Where a phase coincidence substantially occurs between the synchronization signal and the input signal, that is, the phase difference is within a range of $\pm 2\pi/(N \times M)$, then the phase detector produces the up-and down-signals alternately, so that a possible fluctuation is restricted to $$\pm \frac{2\pi}{4 \times 3} \text{ radians} \left( = \pm \frac{\pi}{6} \text{ radians} \right).$$

Although, in the aforementioned embodiment, the synchronization signal has been explained as being compared with the input signal with respect to their phase, it may be phase-compared with another input signal, as the case may be, which is associated with the synchronization signal.

In the PLL circuit of this invention, while use is made of the M number of reference clocks of a frequency N times that of the synchronization signal, as in the prior art circuit, the phase variation of the synchronization signal can be reduced to $2\pi/(N \times M)$ radians and it is, therefore, possible to obtain an M times resolution in comparison with a phase variation of $2\pi/N$ radians in the conventional digital comparator. In order to achieve the same resolution as that in the prior art circuit, it is only necessary to use a reference clock frequency 1/M times that in the prior art circuit. Thus a PLL circuit can be implemented as an inexpensive low-speed unit. Furthermore, with a phase coincidence substantially established between the input signal and the synchronization signal, that is, with a phase difference set within a range of $\pm 2\pi/(N \times M)$, the phase fluctuation of the synchronization signal is restricted to $\pm 2\pi/(N \times M)$.

What is claimed is:

1. A digital phase-locked loop circuit comprising:
   a reference clock generator for generating an M, where M is an integer of 2 or more, number of reference clock inputs having a frequency substantially the same as N times, where N is an integer, the frequency of an input signal and sequentially phase-shifted by $2\pi/M$ radians;
   an M number of counters for frequency dividing the M number of reference clock inputs, the respective counters being sequentially operated upon receipt of a selection signal and each delivering a first, second and third output signal in a predetermined timing relation;
   a phase detector for making a phase comparison between the first output signal of a selected one of said M number of counters and said input signal and producing one of a first signal representing a phase delay of said first output signal of said selected counter and a second signal representing a phase advance of said first output signal of said selected counter; and
   a selection circuit for receiving the signals of said phase detector and the output signals of said M number of counters and sequentially delivering the selection signal in a cyclic fashion in a predetermined direction to said M number of counters to decrease the phase difference between both the signals supplied to said phase detector so that the first output signal of the selected counter is used as a synchronization output signal.

2. The digital phase-locked loop circuit according to claim 1, in which said selection circuit is so operated that when it receives both the first signal from said phase detector and a second output signal from a currently-operated counter it selects a counter supplied with a reference clock whose phase is advanced by $2\pi/M$ radians ahead that of the reference clock input which is supplied to said currently-operated counter and that when it receives both the second signal from said phase detector and the third output signal from said currently-operated counter it selects a counter supplied with a reference clock whose phase is delayed by $2\pi/M$ radians behind the reference clock input which is supplied to said currently-operated counter.

3. The digital phase-locked loop circuit according to claim 1, in which:
   said first output signal from the selected counter appears from when a start of a counting operation of the selected counter until the reference clock is counted N/2 times;
   said second output signal from the selected counter appears from when the reference clock has been counted N times until the selection signal supplied to the selected counter stops; and
   said third output signal from the selected counter appears from when the reference clock has been counted (N+1) times until the selection signal supplied to the selected counter stops.

4. The digital phase-locked loop circuit according to claim 1, in which said first signal representing said phase delay of said first output signal of said selected counter is an up-count signal and said second signal representing said phase delay of said first output signal of said selected counter is a down-count signal.

5. The digital phase-locked loop circuit according to claim 1, in which said predetermined direction is a direction in which said input reference clocks are sequentially phase-advanced with respect to the said counters when said phase comparator delivers the first signal representing said phase delay.

6. The digital phase locked loop circuit according to claim 1, in which said predetermined direction is a direction in which said input reference clocks are sequentially phase-delayed with respect to said counters when said comparator delivers the second signal representing said phase-advance.

* * * * *

UNITED STATES PATENT AND TRADEMARK OFFICE
CERTIFICATE OF CORRECTION

PATENT NO. : 4,715,050

DATED : December 22, 1987

INVENTOR(S) : TANAKA ET AL.

It is certified that error appears in the above-identified patent and that said Letters Patent is hereby corrected as shown below:

In the Abstract, line 19, "click" should be --clock--.

Signed and Sealed this

Twenty-seventh Day of September, 1988

*Attest:*

DONALD J. QUIGG

*Attesting Officer*  *Commissioner of Patents and Trademarks*